(12) United States Patent  (10) Patent No.: US 7,502,601 B2
Dupuis  (45) Date of Patent: Mar. 10, 2009

(54) POWER AMPLIFIER WITH DIGITAL POWER CONTROL AND ASSOCIATED METHODS

(75) Inventor: Timothy J. Dupuis, Austin, TX (US)

(73) Assignee: Black Sand Technologies, Inc., Austin, TX (US)

( * ) Notice: Subject to any disclaimer, the term of this patent is extended or adjusted under 35 U.S.C. 154(b) by 68 days.

(21) Appl. No.: 10/743,218

(22) Filed: Dec. 22, 2003

(65) Prior Publication Data

US 2005/0136865 A1 Jun. 23, 2005

(51) Int. Cl.
*H04B 1/04* (2006.01)
*H03F 3/04* (2006.01)
*H03F 3/14* (2006.01)

(52) U.S. Cl. .............. 455/127.2; 455/127.4; 455/252.1; 330/250; 330/307; 330/272

(58) Field of Classification Search .............. 455/127.2, 455/127.4, 252.1; 330/250, 307, 272, 259, 330/278; 702/57
See application file for complete search history.

(56) References Cited

U.S. PATENT DOCUMENTS

| | | | | |
|---|---|---|---|---|
| 4,360,787 A * | 11/1982 | Galpin | ........................ | 330/284 |
| 5,020,135 A * | 5/1991 | Kasparian et al. | ............. | 455/76 |
| 5,101,173 A * | 3/1992 | DiPiazza et al. | ............ | 330/136 |
| 5,159,283 A * | 10/1992 | Jensen | ........................ | 330/129 |
| 5,365,190 A * | 11/1994 | Yu et al. | ...................... | 330/149 |
| 5,642,075 A * | 6/1997 | Bell | ............................ | 330/129 |
| 5,724,009 A | 3/1998 | Collins et al. | | |
| 5,886,658 A | 3/1999 | Amar et al. | .................. | 341/155 |
| 6,307,429 B1 | 10/2001 | Olgaard | | |
| 6,400,416 B1 | 6/2002 | Tomasz | | |
| 6,462,620 B1 | 10/2002 | Dupuis et al. | | |
| 6,549,071 B1 | 4/2003 | Paul et al. | | |
| 6,605,999 B2 * | 8/2003 | Matsushita et al. | .......... | 330/285 |
| 6,721,370 B1 * | 4/2004 | Kurihara | ...................... | 375/297 |
| 6,727,754 B2 | 4/2004 | Dupuis et al. | | |
| 6,756,849 B2 | 6/2004 | Dupuis et al. | | |
| 6,828,859 B2 | 12/2004 | Dupuis et al. | | |
| 6,839,792 B2 * | 1/2005 | Feldstein et al. | ............ | 710/306 |
| 6,847,904 B2 * | 1/2005 | Blake et al. | ................... | 702/57 |
| 6,894,266 B2 | 5/2005 | Richard et al. | | |
| 2002/0142741 A1 * | 10/2002 | Molnar et al. | ............... | 455/127 |
| 2002/0160734 A1 | 10/2002 | Li et al. | | |
| 2003/0040290 A1 | 2/2003 | Sahlman et al. | | |
| 2003/0152056 A1 * | 8/2003 | Lee et al. | ..................... | 370/338 |
| 2003/0155978 A1 * | 8/2003 | Pehlke | ........................ | 330/296 |
| 2003/0202622 A1 | 10/2003 | Hajimiri et al. | | |
| 2004/0038701 A1 * | 2/2004 | Lin | ............................ | 455/522 |
| 2004/0097250 A1 * | 5/2004 | Gunzelmann et al. | ........ | 455/502 |
| 2004/0148553 A1 | 7/2004 | Nalbantis | | |

(Continued)

FOREIGN PATENT DOCUMENTS

WO WO 01/84741 11/2001

*Primary Examiner*—Duc M Nguyen
(74) *Attorney, Agent, or Firm*—Johnson & Associates (57) ABSTRACT

In a power amplifier, a serial bus interface is provided for sending and receiving information to other devices, such as a baseband controller. The power amplifier includes several control pins that can be used as a serial interface, or alternately, with a direct pin control interface. The serial bus interface can be used with digital power control techniques that provide various advantages over conventional power amplifiers.

17 Claims, 6 Drawing Sheets

U.S. PATENT DOCUMENTS

| | | |
|---|---|---|
| 2004/0162102 A1* | 8/2004 | Gronemeyer et al. .... 455/550.1 |
| 2004/0166822 A1 | 8/2004 | Gronemeyer et al. |
| 2004/0174218 A1 | 9/2004 | Dupuis et al. |
| 2005/0024145 A1 | 2/2005 | Bocock et al. |
| 2005/0068103 A1 | 3/2005 | Dupuis et al. |
| 2005/0218989 A1 | 10/2005 | Tsutsui et al. |

* cited by examiner

POWER AMPLIFIER WITH DIGITAL POWER CONTROL AND ASSOCIATED METHODS

FIELD OF THE INVENTION

This invention relates to the field of power amplifiers. In particular, this invention is drawn to controlling the output power of power amplifiers.

BACKGROUND OF THE INVENTION

Power amplifiers, such as the types of power amplifiers used in wireless communication systems, must be capable of operating at various power levels based on instructions from a controller. A typical prior art power amplifier uses individual pins to control the various functions of the power amplifier. A typical power amplifier may receive signals relating to what band the power amplifier is operating in, and a control signal to control when the power amplifier turns on. A power amplifier may also receive an analog automatic power control signal APC having a power level proportional to the desired output power level.

One problem with prior art power amplifiers is that the their functionality is limited. For example, limitations in the prior art prohibit some features, such as the ability to integrate new functions, or the ability for other devices to read the status of the power amplifier.

Another problem in the prior art relates to controlling the output power of power amplifiers. When the designer of a wireless communication device (e.g., a cellular phone) implements any particular power amplifier with their design, a great amount of effort is required to design ramp profiles for use in controlling the output power of a power amplifier. The characteristics of a desired ramp profile depend on several factors including characteristics of the power amplifier being used, temperature, and battery voltage. As a result, designers typically must design new ramp profiles for every specific design.

SUMMARY OF THE INVENTION

An RF power amplifier according to one illustrative embodiment of the invention includes power amplifier circuitry and memory formed using an integrated circuit. One or more ramp profiles are stored in the memory for use in setting the output power of the power amplifier. In one example, a digital interface is provided to allow a controller to control the output power of the power amplifier.

Another illustrative embodiment of the invention provides a method of amplifying RF signals. One or more ramp profiles are stored using an integrated circuit. To control the output power of the power amplifier, one of the ramp profiles is selected.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In order to provide a context for understanding this description, the following description illustrates one example of a typical application of the present invention. A power amplifier using power control techniques of the present invention may be used for any desired applications, including a wireless transmission system such as mobile or cellular communication devices or other wireless devices. In a wireless device, the wireless device may include a transceiver, an antenna duplexer, and an antenna. Coupled between the transceiver and the antenna duplexer is an RF power amplifier for amplifying signals for transmission via the antenna. In the case of a wireless telephone application, the invention may be applied to GSM, CDMA, PCS, DCS, etc., or any other wireless systems. This is just one example of an application of a power amplifier utilizing the present invention. The invention may also be used in any other application requiring a power amplifier.

In general, the present invention provides an RF power amplifier that is capable of being controlled digitally. In one example, a power amplifier is formed using an integrated circuit. The power amplifier includes a digital interface capable of receiving control information from an external controller. A plurality of ramp profiles are stored in memory on the integrated circuit and are selectively used to control the output power of the power amplifier depending on the desired output power level. The selection of a ramp profile may also take into account information from sensors on the integrated circuit and/or from other parts of the RF device.

The digital interface mentioned above may be take the form of a serial interface. The following description, and FIGS. 1-7, illustrate examples of how a serial interface may be provided to a power amplifier. The serial interface provides the power amplifier with increased flexibility, without the requirement for additional pins. As mentioned above, typical prior art power amplifiers are controlled using a few individual, dedicated pins.

Figure 1:
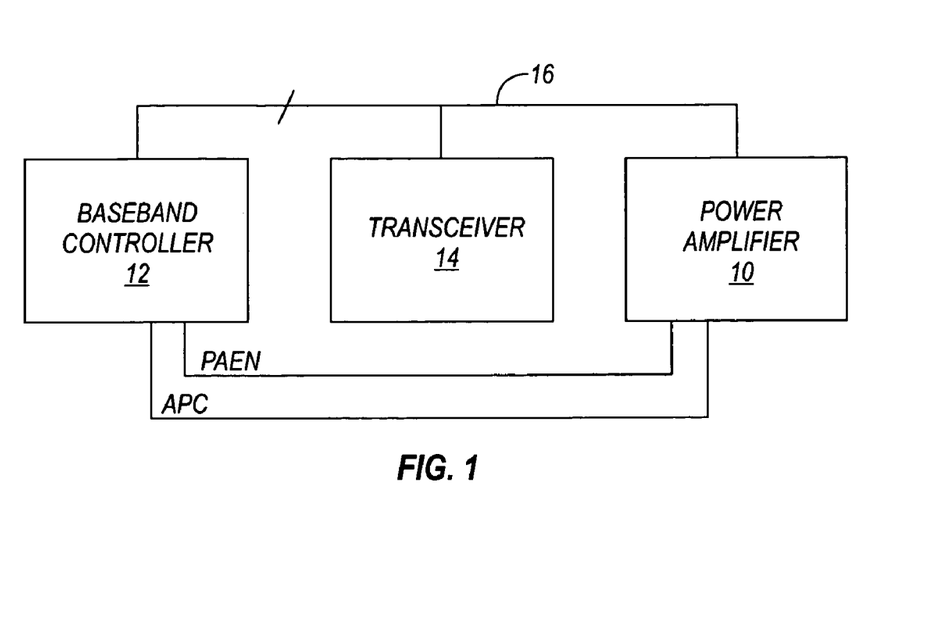
FIG. 1 is a block diagram of a wireless system including a power amplifier and a serial interface.

In contrast, with the present invention, the power amplifier is coupled to a serial interface to receive most of its instructions. FIG. 1 is a block diagram of a wireless system having a power amplifier 10, baseband controller 12, and transceiver 14. A serial interface 16 is coupled to the power amplifier 10, baseband controller 12, and transceiver 14. In one example, the serial bus used with the present invention is similar to an I²C type bus. The baseband controller 12 controls the operation of both the transceiver 14 and power amplifier 10 over the serial interface 16. In addition, the power amplifier 10 also receives PAEN and APC signals from the baseband controller 12. In one example, the power amplifier 10 is integrated in a CMOS chip, which allows many functions to be integrated within the power amplifier. One example of a power amplifier integrated in a CMOS chip is described in commonly-owned U.S. Pat. No. 6,549,071, issued on Apr. 15, 2003, entitled "POWER AMPLIFIER CIRCUITRY AND METHOD USING AN INDUCTANCE COUPLED TO POWER AMPLIFIER SWITCHING DEVICES," which is expressly incorporated by reference herein. For example, the power amplifier can include temperature sensors, digital thermometers, battery sensors, and load conditioning sensing. These functions may use multiple bits of data, which can be communicated with the baseband controller 12 via the serial interface 16.

The power amplifier serial interface provides several advantages over the prior art. First, the serial interface allows many bits to be communicated without using additional pins. Also, the power amplifier can share an existing bus in the system (like in the example shown in FIG. 1), or use a separate bus. If a bus is shared, a controller can provide a single instruction that can be received by the power amplifier, as well as other systems or components coupled to the bus. For example, if the controller sends a mode command to the transceiver, the power amplifier can "snoop" or monitor the bus to automatically determine which mode it should be in. The serial interface can also enable additional features, such as digital power control. In addition to a serial bus, other types of interfaces can also be used. For example, a parallel interface could be used with the power amplifier of the present invention, although more pins would be used.

Figure 2:
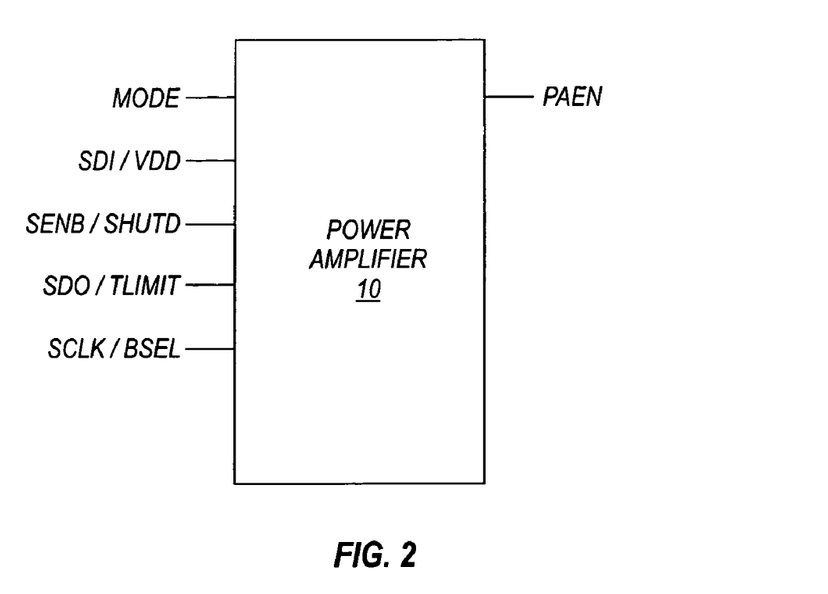
FIG. 2 is a diagram of a power amplifier formed on an integrated circuit.

The power amplifier of the present invention is backwards compatible with systems that do not have a serial bus to communicate with the power amplifier. The power amplifier can operate in either a direct "pin mode" or in the "serial interface mode" when using the serial bus. Another advantage of the present invention is that some of the same pins function during the pin mode or the serial interface mode. FIG. 2 is a diagram of a power amplifier 10 formed on an integrated circuit, showing several of its pins. The MODE pin is used to select the pin mode or the serial interface mode. The PAEN (power amplifier enable) pin is used to communicate to the power amplifier 10 when to turn on. The remaining pins shown in FIG. 2 designate two functions depending on which mode is selected (i.e., serial mode/pin mode).

In pin mode, a standard pin interface is provided to allow programming of the power amplifier 10. A first input pin, BSEL (band select) is used to communicate to the power amplifier which band is being used (e.g., GSM or DCS). A second input pin, VDD is a reference voltage for the digital I/O and allows a user to set the digital I/O levels to be compatible with the baseband I/O levels. A first output pin, TLIMIT (thermal limit signal) triggers if the die temperature exceeds a predefined temperature limit. A second output pin, SHUTD (shutdown) triggers when the thermal limit threshold is crossed. The power amplifier will automatically shut down on the rising edge of SHUTD to protect the power amplifier from damage.

In serial interface mode, a serial port is employed to allow programming of the power amplifier 10. If desired, the serial port can be shared with other devices (e.g., a transceiver, etc.) in addition to the baseband controller. The serial port allows access to certain features and internal registers that are not available in the pin control mode. A first input pin, SCLK (serial clock) receives the serial clock signal. A second input pin, SENB (serial enable) controls when the serial port is enabled. A third input pin, SDI (serial data out) is the serial data input pin. An output pin, SDO (serial data out) is the serial data output pin.

One example of a feature that is enabled by the serial interface relates to thermal protection. In serial interface mode, a user may access programmable registers associated with thermal protection. If the die temperature exceeds a predetermined temperature setting, the baseband controller is alerted via the TLIMIT pin. If the die temperature exceeds a predetermined temperature, the power amplifier is automatically powered down to prevent device damage. These conditions may be detected by the baseband controller by monitoring the serial bus.

There are several design issues that should be considered in implementing a serial bus in an RF power amplifier. For example, bus noise can cause spurs in the RFO frequency spectrum. Another issue is that during an RF burst, large voltages and currents at the RF carrier frequency can be induced in the serial bus lines causing loss and potential problems in logic circuits in the transceiver and baseband controller. Another issue is that high speed I/O's have electrostatic discharge (ESD) issues. Another issue relates to the number of pins needed to implement the serial interface. The following discusses design considerations relating to those issues.

As mentioned above, bus noise can cause spurs in the power amplifier output RFO frequency spectrum. The present invention disables the serial bus during RF bursts. With the serial bus used with the present invention, the serial clock (SCLK) operates when data is being transferred, which happens between bursts.

Figure 3:
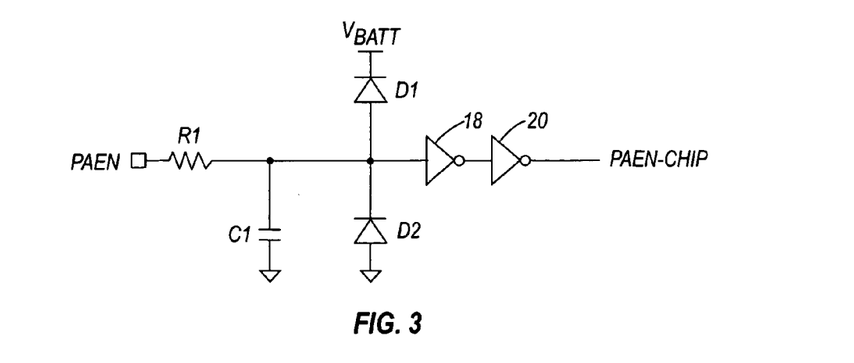
FIG. 3 is a schematic diagram illustrating the filter used on control signal pins.

To address large voltages and currents induced at the RF carrier frequency during the RF burst, the present invention uses several approaches. For slower control signals (e.g., PAEN) a filtering circuit is used. FIG. 3 is a schematic diagram illustrating the filter used on slower control signal pins. In FIG. 3, signals sent to the PAEN pin are filtered by a low pass RC filter comprised of resistor R1 and capacitor C1. The filtered signal is connected between $V_{BATT}$ and ground via diodes D1 and D2. The filtered signal is then inverted twice by inverters 18 and 20 to provide the internal power amplifier enable signal PAEN-CHIP. The signal PAEN is the signal that enables the power amplifier and is active during the entire burst. This signal is not used to communicate high speed digital data, so the low pass filter can be used to remove the RF pickup.

Figure 4:
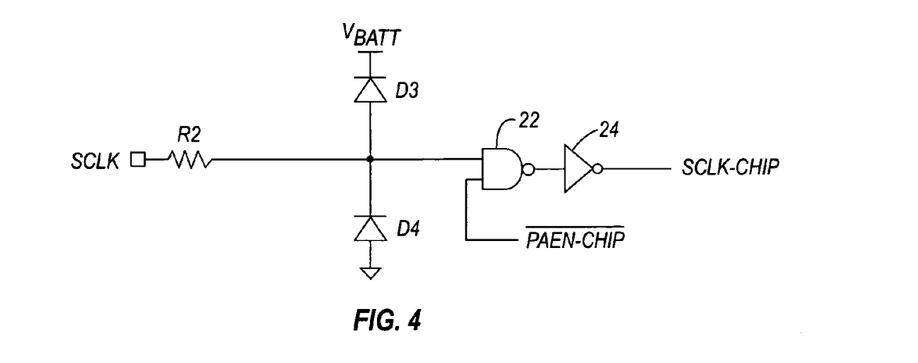
FIG. 4 is a schematic illustrating a blocking gate circuit.

For the faster signals (e.g., SCLK, SENB, SDI), the present invention uses a blocking gate that is enabled during the RF burst. FIG. 4 is a schematic illustrating a blocking gate circuit. FIG. 4 shows the non-filtered gate block circuit that is used with the serial clock SCLK signal. As shown, the SCLK signal passes through resistor R2, and is coupled between $V_{BATT}$ and ground via diodes D3 and D4. The signal is then provided as a first input to NAND gate 22. A second input of NAND gate 22 is coupled to the inverted power amplifier enable signal $\overline{\text{PAEN-CHIP}}$, which is low during a burst. The output of the NAND gate 22 is inverted by inverter 24, to provide the internal serial clock signal SCLK-CHIP. During a burst, the signal SCLK-CHIP will always be high, essentially disconnecting the input signal SCLK. This same technique is used on other high speed bus input signals SENB and SDI, preventing logic glitches and power supply current.

Figure 5:
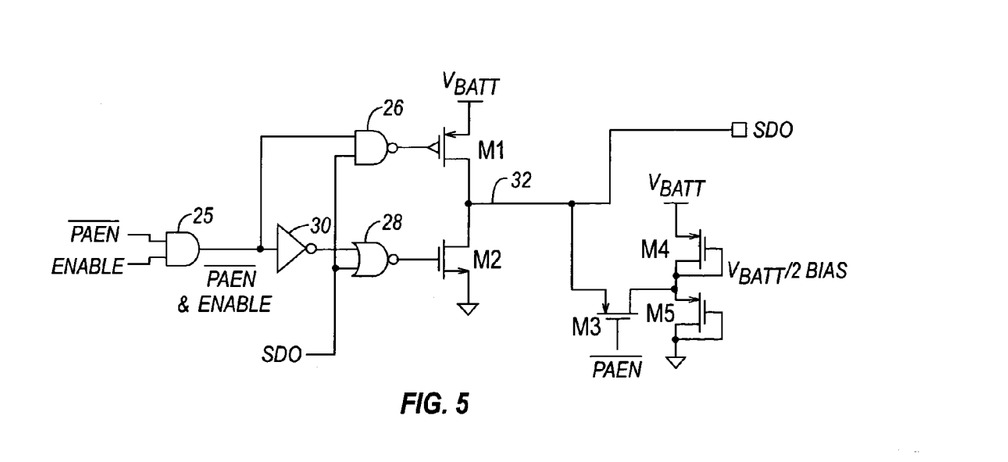
FIG. 5 is a schematic diagram illustrating how the serial digital output pin is driven.

During a burst, the serial data output pin is dealt with differently. The output is not filtered in the same way described above because of the amount of current that is driven. Instead, a driver is provided to drive either a "1" or a "0". FIG. 5 is a schematic diagram illustrating how the serial digital output pin is driven. Generally, a tri-state driver is provided so that, when an output signal is being driven between bursts, the driver drives a "1" or a "0." During a burst, and when a read-back is not occurring, the pin is tri-stated and a bias signal is applied to it.

As shown in FIG. 5, the inverted power amplifier enable signal $\overline{PAEN}$ and the bus enable (ENABLE) signal are provided as inputs to AND gate 25. The output of AND gate 25 ($\overline{PAEN}$ & ENABLE) is coupled to an input of NAND gate 26, and to an input of NOR gate 28, after being inverted by inverter 30. During a burst, when $\overline{PAEN}$ is low and ENABLE is high, the outputs of NAND gate 26 and NOR gate 28 will be "1" and "0," respectively, regardless of the signal at SDO. As a result, switching devices M1 and M2 will both be off during a burst, making node 32 (which is also SDO) tri-stated. FIG. 5 also shows a low current bias circuit, comprised of switching devices M3, M4, and M5, which is connected to node 32 during a burst.

The bias circuit biases the node 32 to $V_{DD}/2$ during the burst. As a result, the RF voltage pickup signal will appear across the tri-state devices and will not turn on the parasitic diodes to ground and $V_{BATT}$, which reduces loss and reduces the RF voltage present on the digital line. In other words, during bursts, a goal is to keep diodes turned off while maximizing the impedance seen looking into the output pin SDO. Between bursts, when $\overline{PAEN}$ is high and the driver is enabled, the outputs of NAND gate 26 and NOR gate 28 will both be the inversion of SDO, which makes node 32 (or SDO at the output of the chip) equal to the value of SDO. Also, when $\overline{PAEN}$ is high, switching device M3 will be off so the bias circuit will not be applied to node 32. It is desirable when designing the power amplifier integrated circuit to choose the output pin SDO to be the pin on the package to be the pin with reduced pickup.

As mentioned above, the high speed I/O's have ESD issues. To help reduce the RF current in the I/O loops, a series resistor (e.g., resistor R2 in FIG. 4) is used, and the capacitance at the inputs is reduced. However, the use of the series resistors can cause low ESD performance since a discharge can cause high current in the resistor, resulting in thermal damage. There is a trade-off when choosing the size of the resistor since a larger area resistor will have better ESD performance, but will have a higher capacitance. One suitable example for the series resistor is a 3 kohm poly resistor, which will have a relatively good RF performance and will meet 200 V ESD.

It is desirable that the serial interface of the present invention have as few pins as possible due to the RF issues described above. In addition, it is desirable that the serial port interface also work in pin mode to be backwards compatible with existing power amplifiers. In addition, the digital interface levels are different (lower) than the battery voltage. As a result, a reference $V_{DD}$ is supplied, and level shifters are used at the inputs and outputs.

As described above with respect to FIG. 2, four of the power amplifier pins function under either the pin mode or the serial interface mode. As described above, in the serial interface mode (when the MODE pin is high), the pins define a serial interface using pins SDI, SDO, SENB, and SCLK. When MODE is high, the MODE pin is used as the $V_{DD}$ for the input and output level shifters (described below). In the pin control mode (MODE is low), the pins are defined as a pin control using pins BSEL, TLIMIT, and SHUTD. In this case, the SDI/VDD pin should be connected to $V_{DD}$ which provides the supply for the input/output level shifters.

Figure 6:
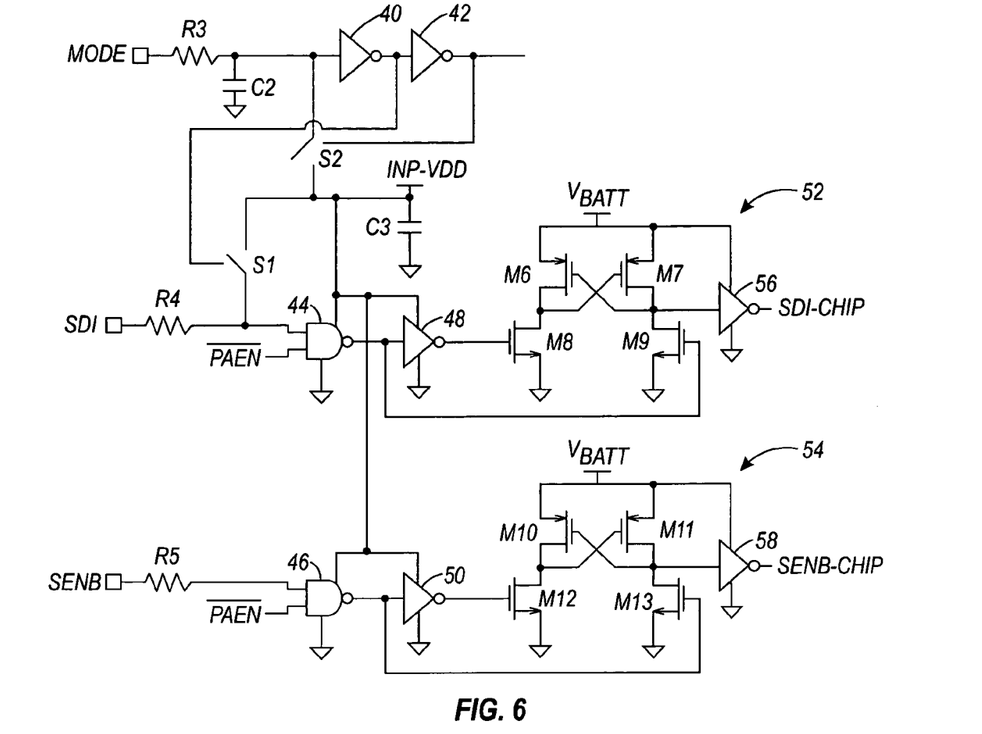
FIG. 6 is a schematic diagram of three of the power amplifier pins illustrating how the reference VDD is supplied.

FIG. 6 is a schematic diagram of three of the power amplifier pins illustrating how the number of pins are minimized, and how the reference $V_{DD}$ is supplied. First, looking at the MODE pin, filter circuitry (resistor R3 and capacitor C2) is provided similar to that shown in FIG. 3. When MODE is high (serial interface mode), then the filtered signal is inverted twice by inverters 40 and 42. The outputs of inverters 40 and 42 each control a switch S1 and S2, respectively.

In serial interface mode, switch S1 will be open and switch S2 closed, which causes the voltage at pin MODE to become the internal reference power supply (INP-VDD). As shown, INP-VDD supplies NAND gates 44 and 46, as well as inverters 48 and 50. Since the MODE signal comes from the baseband controller, the internal reference power supply will be compatible with the baseband controller voltage levels. Pins SDI and SENB include circuits similar to the circuit shown in FIG. 4. The signals pass through resistors R4 and R5, and then through the NAND gates 44 and 46, between bursts. During bursts, the outputs of the NAND gates 44 and 46 will be constant, regardless of the signals at the SDI and SENB pins. FIG. 6 also shows level shifters 52 and 54 which shift the signal level to the $V_{BATT}$ level. The level shifters are comprised of switching devices M6 through M13 and inverters 56 and 58. In pin mode, switch S1 will be closed and switch S2 will be open. In pin mode, the internal voltage supply INP-VDD will no longer be equal to the voltage on the MODE pin.

Figure 7:
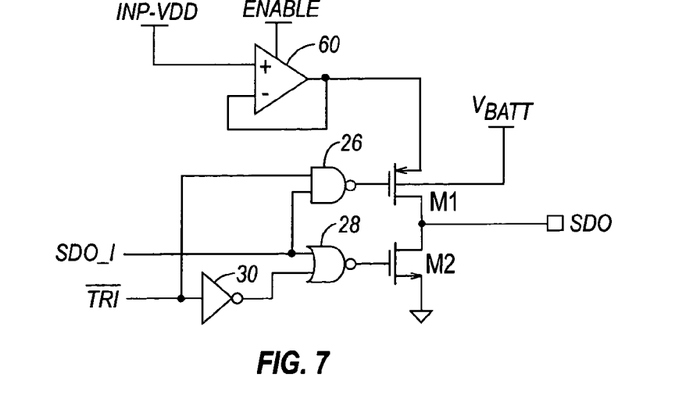
FIG. 7 is a schematic diagram of the buffer amplifier used for driving the SDO output signal.

Another feature of the present invention relates to how the serial output signal at SDO is driven. Since the signal on the SDO pin is provided to the baseband chip, it is desirable for the voltage level to be compatible with the level at the baseband chip. However, it may be impractical to pull much current from INP-VDD, which is provided by the MODE pin. To solve this problem, a buffer amplifier is used when transmitting a signal over the serial bus. FIG. 7 is a schematic diagram of the buffer amplifier used for driving the SDO output signal. FIG. 7 is similar to what is shown in FIG. 5, with the addition of op-amp 60, which buffers INP-VDD to provide the drive. The buffer circuitry allows more current to be drawn from the battery, rather than from INP-VDD. Since the op-amp 60 consumes power when enabled, it is enabled when the user requests a read-back through the serial interface. When the user is not requesting a read back, SDO is tri-stated.

Figure 8:
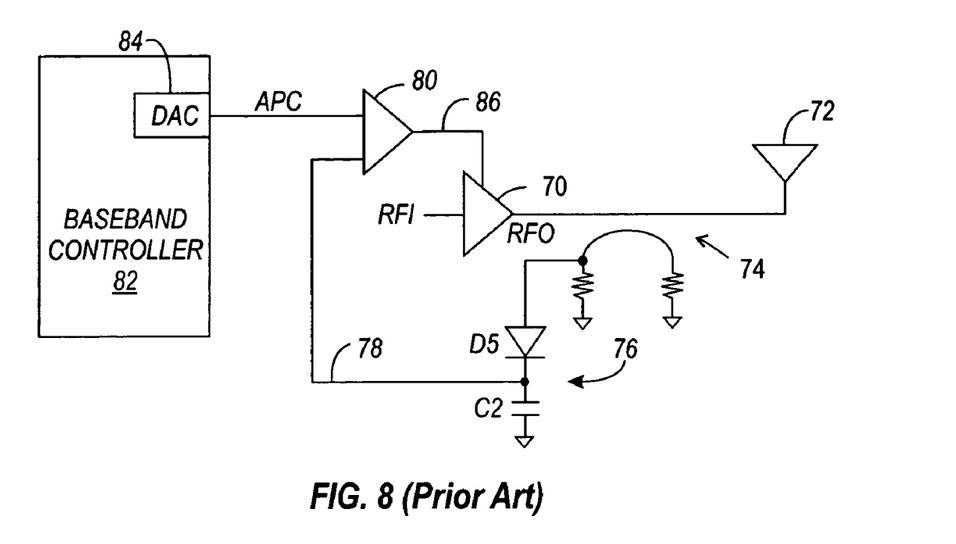
FIG. 8 is a block diagram of a prior art cellular phone power amplifier and controller.

As mentioned above, a serial interface enables several features, including digital power control. To better understand the power control functions of the present invention, following is a description of how output power is controlled in typical prior art power amplifiers. FIG. 8 is a block diagram of a prior art mobile phone power amplifier and controller. FIG. 8 shows a power amplifier 70 having an RF input RFI and an RF output RFO, which is connected to an antenna 72. A directional coupler 74 senses the output power provided to the antenna for use in a feedback loop. A power detector comprised of diode D5 and capacitor C2 create a feedback signal 78, which is provided as one input to an op-amp 80. A baseband controller 82 includes a digital to analog converter (DAC) which generates an analog power control signal APC that relates to a desired output power level. The signal APC is provided as a second input to the op-amp 80. The op-amp 80 compares the feedback signal 78 and APC to generate a power control signal 86, which controls the output power level of the power amplifier 70. In this prior art system, multiple integrated circuits are used to implement the system, and the signals between chips are analog. This type of design provides a challenge to designers who must implement good layout and part placement, since noise and un-wanted signals coupling into the analog signals can cause problems.

An improved interface is described above with respect to FIGS. 3-9. A power amplifier system using the improved interface and the power control techniques (described below) can be implemented in a single chip design, or in a multi-chip module.

Figure 9:
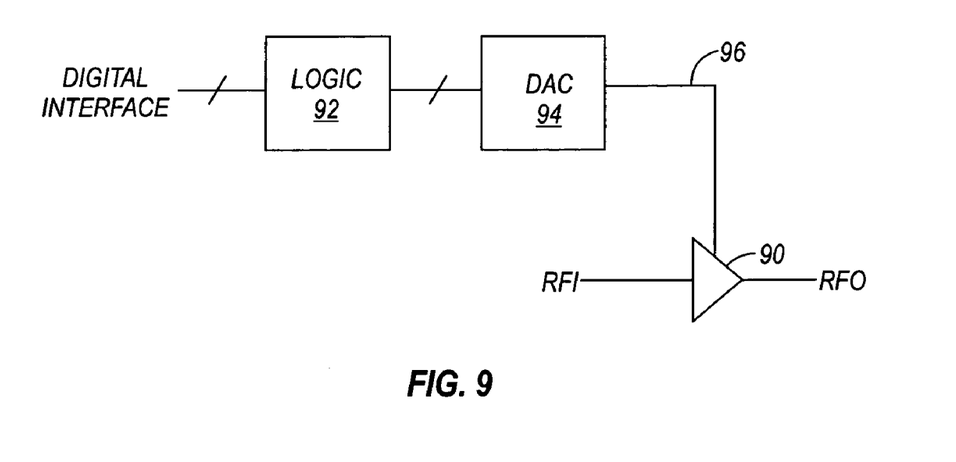
FIG. 9 is a block diagram of a power amplifier design of the present invention.

FIG. 9 is a block diagram of a single chip power amplifier design of the present invention. FIG. 9 shows a power amplifier 90 having an input RFI and an output RFO connectable to an antenna (not shown). The digital interface is connected to logic circuitry 92, such as circuitry described above with respect to FIGS. 3-9. The digital interface is connectable to a baseband controller (not shown) to provide communication with the baseband controller. The logic circuitry 92 is connected to digital to analog converter (DAC) circuitry 94. When the baseband controller sends information relating to a desired output power level, the DAC 94 generates a power control signal 96, which controls the output power of the power amplifier 90.

Figure 10:
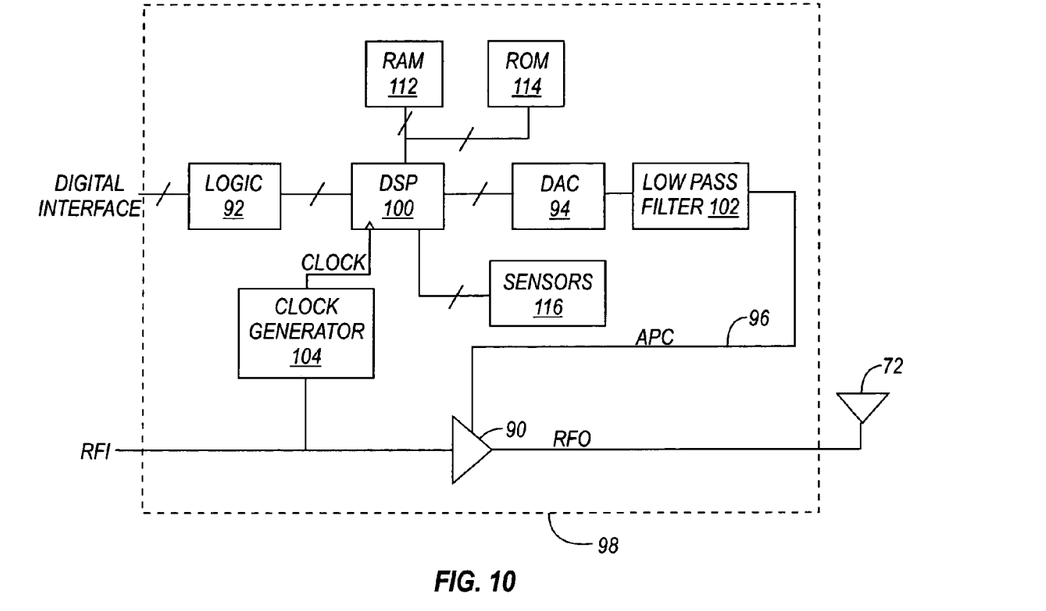
FIG. 10 is a block diagram of a power amplifier of the present invention incorporated on a single chip.

FIG. 10 is a more detailed block diagram of a power amplifier formed on a chip 98. In one example, the chip is implemented in CMOS, although other technologies could also be used. In this example, a digital signal processor engine (DSP) 100 is incorporated into the chip 98. The DSP 100 generates or selects ramp profiles based on information coming from a baseband controller (not shown) over the digital interface. When the DSP 100 selects a ramp profile, the DAC 94 will convert the profile into an analog power control signal, which is filtered by low pass filter 102 to generate analog power control signal APC 96, which controls the output power of the power amplifier 90. The DSP 100 runs during the RF bursts and should be designed for low noise so it does not cause spurs at output RFO.

Figure 11:
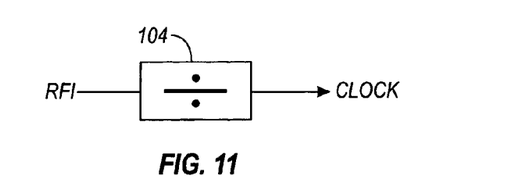
FIG. 11 is a block diagram of one example of clock generator circuit.

The DSP 100 is clocked from a clock signal (CLOCK) that is generated by clock generator 104. FIG. 11 is a block diagram of one example of clock generator 104. FIG. 11 shows a divider 104 the divides the RF input signal RFI to generate the clock signal CLOCK. Since the DSP 100 and DAC 94 run during the power amplifier burst, they are be designed such that they do not create RF spurs at the power amplifier output. In another example, a clock signal is provided externally to a pin on the chip 98.

Referring back to FIG. 10, a user of the power amplifier chip 98 can use the the digital interface to download desired ramp profiles. Also, multiple ramp profiles can be stored in an on-chip RAM 112 and/or ROM 114. The power amplifier is also capable of using one or more sensors 116 when controlling the output power level. For example, the temperature of the power amplifier can be sensed and used when selecting a ramp profile. In another example, the battery voltage can be sensed and used to select the appropriate ramp profile. Also, the DSP 100 can generate ramp profiles based on an internal algorithm, while taking into account one or more variables (e.g., required power, temperature, battery voltage). Sensors can also be used to sense other conditions, if desired. Whether a ramp profile is selected or created, the profile can be scaled according to the desired power level the user programs.

The power control technique of the present invention provides several advantages over the prior art. First, the digital interface makes the power amplifier very easy to use and to design into a system. Also, as a result of the internal sensors, more optimum ramp profiles can be used than are possible in the prior art. And, since the entire power control and ramping is integrated with the power amplifier in one part, complex algorithms can be used to give optimum ramp performance, while having an easy to use and program part. Another advantage of the present invention relates to testing the power amplifier. Since the ramp profiles and control algorithms are contained in the power amplifier, the power amplifier can be tested without having to build the entire system with which it is used.

Figure 12:
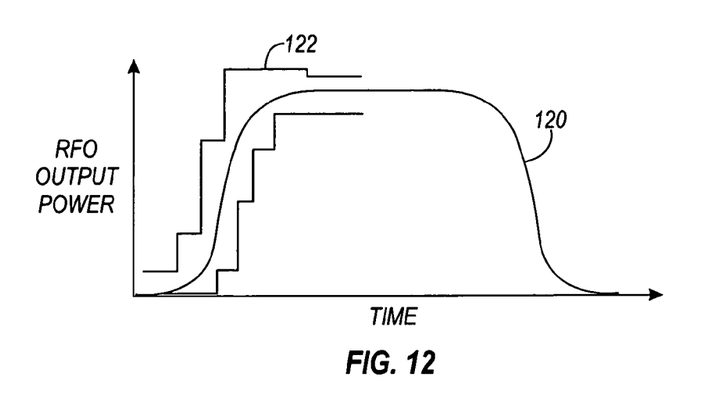
FIG. 12 is a diagram of an exemplary power ramp.

To help illustrate the value of some of these advantages, following is background information relating to the design of power ramp profiles. When designing ramp profiles, there are requirements for meeting time domain power masks and spectral frequency domain masks over a range of temperatures, battery voltages, and power levels. FIG. 12 is a diagram of an exemplary power ramp. FIG. 12 shows a power ramp 120 and an example of a time domain power mask 122. Typically, a modified raised cosine function is used to create the power ramp. When designing power ramps, they should fall within the time domain mask and the frequency domain mask, as defined by the relevant specifications. In typical prior art systems, the power ramp profile is designed by a system designer and is contained in the baseband DSP chip. The ramp profile typically is highly dependent on the particular power amplifier used. Therefore, system designers go through this process for every design, or for every power amplifier used. In contrast, with the present invention, the complete power ramping function is integrated in the power amplifier and will largely be the same for various applications.

Following is one example of how a power amplifier is controlled in one possible implementation. First, the baseband controller writes to a digital register in the power amplifier (via the digital interface) to set the desired output power. When a burst is desired, the baseband chip raises the PAEN signal. When PAEN goes high, the power amplifier DSP will select and scale a ramp profile stored in memory based on the desired power level, and on sensors such as temperature and battery voltage. To help minimize noise, the ramp can be pre-computed between bursts and stored in memory, so that during the burst, the data is read and presented to the DAC to generate the analog internal APC signal.

Since the entire ramp generation is included on the power amplifier chip, the ramp profiles can be designed by the power amplifier designers and stored in the power amplifier ROM. One factor that will vary from different applications designs is the loss associated with the antenna switch module and the antenna. To compensate for this loss, a user can program an internal power amplifier register with this loss, and the power amplifier DSP can compensate correctly for the loss. In this example, a user (i.e., someone designing a system that uses the power amplifier of the present invention) would need merely to program the antenna loss factor, the desired output power, and use PAEN to enable the power amplifier. Therefore, there would be no need for the user to create power ramp profiles.

Figure 13:
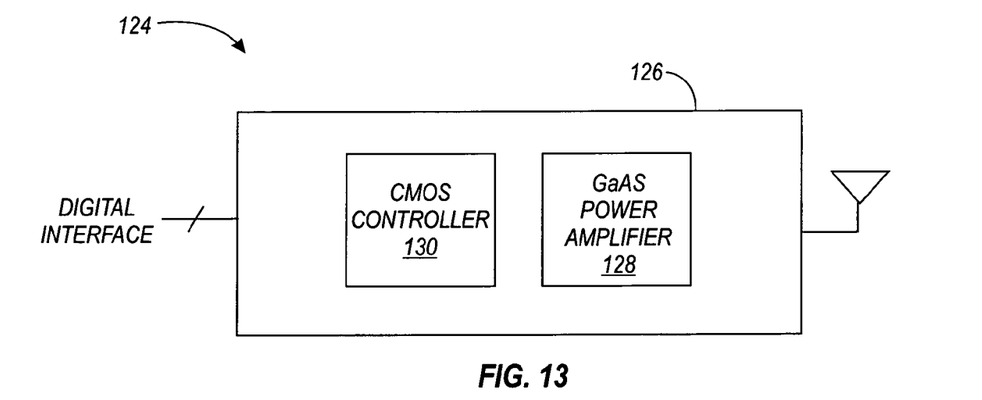
FIG. 13 is a block diagram of a power amplifier implemented as a module with multiple chips.

While the digital power control techniques of the present invention have been described with respect to a power amplifier implemented using a single chip, other variations are also possible. FIG. 13 is a block diagram of a power amplifier implemented as a module containing multiple chips. FIG. 13 shows a power amplifier module 124. The module 124 includes a printed circuit board 126 and a plurality of chips mounted to the circuit board or substrate 126. A power amplifier chip 128 contains the power amplifier circuitry. In the example shown, the power amplifier chip 128 is implemented in GaAs. A CMOS controller chip 130 is also mounted to the board 126 and contains the control circuitry for the power amplifier. Referring to FIG. 10, the controller chip 130 may contain all of the components shown in FIG. 10, except for the power amplifier. The functionality of the power amplifier module 124 is substantially the same as that described above.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. A method of amplifying RF signals comprising:
providing an RF power amplifier formed on an integrated circuit;
storing a plurality of ramp profiles in the integrated circuit;
receiving one or more digital control signals containing power control data from a controller that is external to the integrated circuit, wherein the control signals are received over a digital interface; and
selecting one of the ramp profiles using a digital signal processor to vary the output power of the RF power amplifier based on a desired output power level relating to one or more of the digital control signals from the controller.

2. The method of claim 1, further comprising sensing one or more properties related to the integrated circuit.

3. The method of claim 2, wherein one of the one or more properties sensed is the temperature of the integrated circuit.

4. The method of claim 2, wherein one of the one or more properties sensed is the voltage of a battery.

5. The method of claim 2, wherein the ramp profile is selected based on a received power control signal and a sensed property.

6. The method of claim 1, further comprising using the selected ramp profile to generate a power control signal for controlling the output power of the RF power amplifier.

7. The method of claim 6, further comprising providing a digital to analog convener for generating the power control signal.

8. The method of claim 1, further comprising generating a clock signal for use by the digital signal processor.

9. The method of claim 8, further comprising dividing an RF input signal to generate the clock signal.

10. A method of controlling a wireless communication device comprising:
providing a baseband controller;
providing an integrated circuit having an RF power amplifier, memory, a digital interface, and an RF input, all formed using the integrated circuit;
forming a digital signal processor using the integrated circuit;
storing a plurality of ramp profiles in the memory formed using the integrated circuit;
sending a digital power control signal from the baseband controller to the integrated circuit using the digital interface, wherein the digital power control signal relates to a desired output power level;
selecting one of the plurality of ramp profiles based on the digital power control signal received from the baseband controller; and
using the selected ramp profile to control the output power of the RF power amplifier.

11. The method of claim 10, further comprising providing a digital interface between the baseband controller and the integrated circuit.

12. The method of claim 10, further comprising providing a serial interface between the baseband controller and the integrated circuit.

13. The method of claim 10, further comprising:
sensing the temperature of the integrated circuit; and
selecting the ramp profile based on the power control signal and the sensed temperature.

14. The method of claim 10, further comprising:
sensing the battery voltage of the wireless communication device; and
selecting the ramp profile based on the power control signal and the sensed battery voltage.

15. The method of claim 10, wherein the digital signal processor selects one of the plurality of ramp profiles.

16. The method of claim 10, further comprising downloading ramp profiles to the digital signal processor.

17. The method of claim 10, further comprising providing a digital to analog converter using the integrated circuit for generating a control signal based on the selected ramp profile.

* * * * *